United States Patent
Kurokawa

Patent Number: 5,291,064
Date of Patent: Mar. 1, 1994

[54] PACKAGE STRUCTURE FOR SEMICONDUCTOR DEVICE HAVING A FLEXIBLE WIRING CIRCUIT MEMBER SPACED FROM THE PACKAGE CASING

[75] Inventor: Yasuhiro Kurokawa, Tokyo, Japan

[73] Assignee: NEC Corporation, Tokyo, Japan

[21] Appl. No.: 870,033

[22] Filed: Apr. 16, 1992

[30] Foreign Application Priority Data

Apr. 16, 1991 [JP] Japan .................. 3-111055
May 31, 1991 [JP] Japan .................. 3-155285

[51] Int. Cl.5 .............. H01L 23/02; H01L 25/04; H01L 23/12; H01L 39/02
[52] U.S. Cl. .................. 257/714; 257/706; 257/707; 257/709; 257/717
[58] Field of Search .............. 257/714, 721, 715, 722, 257/678, 703, 704, 705, 706, 709, 712, 713, 717, 718, 719, 731, 734, 774, 798, 707

[56] References Cited

U.S. PATENT DOCUMENTS

| | | | |
|---|---|---|---|
| 4,047,198 | 9/1977 | Sekhon et al. | 257/715 |
| 4,561,011 | 12/1985 | Kohara et al. | 257/722 |
| 4,612,601 | 9/1986 | Watari | 257/722 |
| 4,748,538 | 5/1988 | Tsuji | 257/722 |

Primary Examiner—Andrew J. James
Assistant Examiner—Carl Whitehead, Jr.
Attorney, Agent, or Firm—Laff, Whitesel, Conte & Saret

[57] ABSTRACT

A packaged semiconductor device has a wiring substrate. A plurality of semiconductor device chips are connected to the wiring substrate by a use of bumps. A heat sink is bonded through a high heat conductive bonding layer to a surface of each of the semiconductor device chips. In addition, a package casing which accommodates the semiconductor device chips and the wiring substrate, has internal conductors which are positioned in the inside of the package casing. External connection pins extend outwardly from the package casing and are connected to corresponding internal conductors. The wiring substrate is connected to the internal conductors of the package casing via a flexible wiring circuit member. The flexibility of this wiring permits the thermal expansion and contraction to occur without breaking the connections to the bumps.

8 Claims, 6 Drawing Sheets

PACKAGE STRUCTURE FOR SEMICONDUCTOR DEVICE HAVING A FLEXIBLE WIRING CIRCUIT MEMBER SPACED FROM THE PACKAGE CASING

BACKGROUND OF THE INVENTION

1. Field of the Invention

The present invention relates to a high density package structure for semiconductor devices, and more specifically to a high density, high heat dissipating, high reliable package structure for semiconductor devices.

2. Description of Related Art

Recently, semiconductor devices have a remarkable inclination of a large power consumption and a large chip size caused by increase of an integration density and speed-up of operation. In addition, for increased connection terminals, an increased package density and shortened delay times, consideration is now made on a flip-chip connection method which uses solder bumps of 100 $\mu$m to 200 $\mu$m in diameter. For example, semiconductor device chips are connected on a wiring substrate by use of for example bumps of $Pb_{95}Sn_5$. The flip-chip connection using the bumps enables a high density package since a package area is substantially the same as that of the chip size, and also, a high speed signal propagation because of a shortened connection distance. Furthermore, since a whole surface of the chip is a connectable area, the number of external terminal pins can be increased.

However, a stress occurs due to difference in heat expansion between the wiring substrate and the semiconductor device chips in the flip-chip connection, and the stress will cause a thermal fatigue of the solder. As a result, heat cycle reliability is low.

Therefore, in order to obtain a connection reliability, it has been attempted to use mullite and aluminum nitride, which has a thermal expansion coefficient near to that of silicon, or silicon itself, as a substrate material.

At room temperature, most of heat generated from the semiconductor device chip is dissipated through a solid member in the inside of the package to atmosphere, by a thermal conduction. However, since the conventional package structure is such that the semiconductor device chips are connected to the wiring substrate by only the bumps having the diameter of 100 $\mu$m to 200 $\mu$m, the heat dissipation characteristics is not satisfactory. Therefore, it has been difficult to use the conventional package structure of the flip-chip type to a high power device.

In addition, in order to effectively dissipate a large amount of heat generated by semiconductor devices due to the increased integration density, Japanese Patent Application Laid-open No. 007456/1990 proposes a forced liquid cooling integrate circuit package, in which each of semiconductor device chips has its one principal surface connected to a wiring substrate by means of solder bumps, and its other principal surface connected to a flexible plate of a water jacket. In this structure, each semiconductor device chip is sandwiched and compressed between the wiring substrate and the flexible plate of a water jacket, so that the heat generated by each semiconductor device chip is dissipated from the one principal surface of the semiconductor device chip through the bumps and from the other principal surface of the semiconductor device chip to the flexible plate of a water jacket.

However, since a compressing stress acts on the bumps of 100 $\mu$m to 200 $\mu$m in diameter, fatigue is easy to occur in the solder bumps. In addition, it is difficult to work or process the semiconductor device chips, the solder bumps, a casing and the flexible plate of a water jacket, and they require an extremely high precision of size. Therefore, it is very expensive. Furthermore, since the cooling method is a forced cooling using a liquid, the package inevitably becomes a large size, and therefore, can be used in only a limited field of application.

SUMMARY OF THE INVENTION

Accordingly, it is an object of the present invention to provide a semiconductor device package structure which has overcome the above mentioned defect of the conventional one.

Another object of the present invention is to provide a semiconductor device package structure having an excellent heat dissipation characteristics and a high connection reliability.

The above and other objects of the present invention are achieved in accordance with the present invention by a packaged semiconductor device comprising a wiring substrate, a plurality of semiconductor device chips each having a first surface electrically and mechanically connected to the wiring substrate by use of bumps, and a heat sink bonded through a high heat conductive bonding layer to a second surface of each of the semiconductor device chips opposite to the first surface thereof, the wiring substrate and the heat sink being formed of the same material.

According to another aspect of the present invention, there is provided a packaged semiconductor device comprising a wiring substrate, a plurality of semiconductor device chips each having a first surface electrically and mechanically connected to the wiring substrate by use of bumps, a heat sink bonded through a high heat conductive bonding layer to a second surface of each of the semiconductor devices opposite to the first surface thereof, and a package casing accommodating the semiconductor device chips and the wiring substrate therein and having internal conductors positioned in the inside of the package casing and external connection pins extending outwardly from the package casing and connected to corresponding internal conductors, the wiring substrate being connected to the internal conductors of the package casing through a flexible wiring circuit member.

Alternately, in place of providing the flexible wiring circuit member connecting between the wiring substrate and the internal conductors of the package casing, the wiring substrate itself can be formed of a flexible wiring circuit member and connected directly to the internal conductors of the package casing.

With the above mentioned arrangement, since the second surface of each semiconductor device chip is surface-contacted to the head sink through the high heat conductive bonding layer, the heat generated in each semiconductor device chip is effectively transferred and dissipated to the heat sink. Therefore, each semiconductor device chip is effectively cooled.

In the case that the wiring substrate and the heat sink are formed of the same material, when the heat sink is bonded to the second surface of all the semiconductor device chips having the first surface already connected to the wiring substrate by use of bumps, it is possible to reduce or suppress approximately to zero, a stress of the bumps which would be caused by a difference in heat expansion between the wiring substrate and the heat sink.

In the case that the wiring substrate is connected to the semiconductor device chips through the bumps and also connected to the internal conductors of the package casing through the flexible wiring circuit member or the wiring substrate itself is formed of the flexible wiring circuit member, the stress of the bumps, which would be caused by the compression between the wiring substrate and the water jacket plate in the prior art, can be reduced to almost zero. Therefore, connection reliability is excellent. In addition, if patterned signal conductors and patterned ground conductors are formed on the flexible wiring circuit member, it becomes possible to control a characteristic impedance which is very important in a high frequency area.

The semiconductor device chips are usually formed of silicon, GaAs or InP, but can be formed of any other semiconductor material.

The heat sink can be formed of a single substance material or a composite material, such as aluminum nitride, aluminum carbide, alumina, boron nitride, beryllium oxide, silicon, diamond, copper, tungsten, aluminum, since these materials have a good heat conductivity and therefore are preferable from the total viewpoint of a heat dissipation property and a connection reliability. However, the heat sink is in no way limited to the materials mentioned above.

On the other hand, the wiring substrate has a wiring conductor pattern formed on a surface or in the inside of the wiring substrate for purpose of interconnecting the semiconductor device chips. Therefore, the wiring substrate is preferably formed of an insulator material. However, in the case that the wiring substrate and the heat sink are formed of the same electrically conductive material, the wiring conductor pattern is formed through an insulator layer on the surface of the wiring substrate. In the case that the wiring substrate and the heat sink are formed of different materials, the wiring substrate can be preferably formed of an electrically insulative substrate which is formed of alumina, mullite, aluminum nitride, glass ceramics, glass epoxy, or insulative resin such as polyimide, and which has one or more conductor layers formed on the surface or in the inside of the substrate. However, the wiring substrate is in no way limited to these materials.

The bumps are formed of a metal alloy such as PbSn, PbIn, AuSn, or a single substance metal such as Au or Ag, or a conductive resin composite material.

The high heat conductive bonding layer can be formed of a solder or a bonding agent having a high heat conductivity. In this connection, if the semiconductor device chips are bonded to the heat sink by a solder, a metallized pattern is formed on a bonding surface of the heat sink. However, if the semiconductor device chips are bonded to the heat sink by a bonding agent, it is unnecessary to metallize the bonding surface of the heat sink.

Furthermore, in order to further improve the heat dissipation property, it is effective to provide a radiator fins for air cooling on the heat sink or couple the heat sink to a metal jacket for liquid cooling.

In addition, the flexible wiring circuit member can be formed of a film of 10 $\mu$m to 200 $\mu$m in a thickness which is composed of a usual resin material such as polyester, polyimide, polyamide, polyamide-imide, polyether-imide, glass cloth epoxy, and which has a conductor pattern formed on the film. The conductor pattern formed on the film can be formed of copper, silver, nickel, tin, chromium, gold, etc., and can have a single layer structure or a multilayer structure. Furthermore, the flexible wiring circuit member can be in a multilayer structure formed by alternately stacking conductor layers and insulator layers.

The above and other objects, features and advantages of the present invention will be apparent from the following description of preferred embodiments of the invention with reference to the accompanying drawings.

DESCRIPTION OF THE PREFERRED EMBODIMENTS

Figure 1:
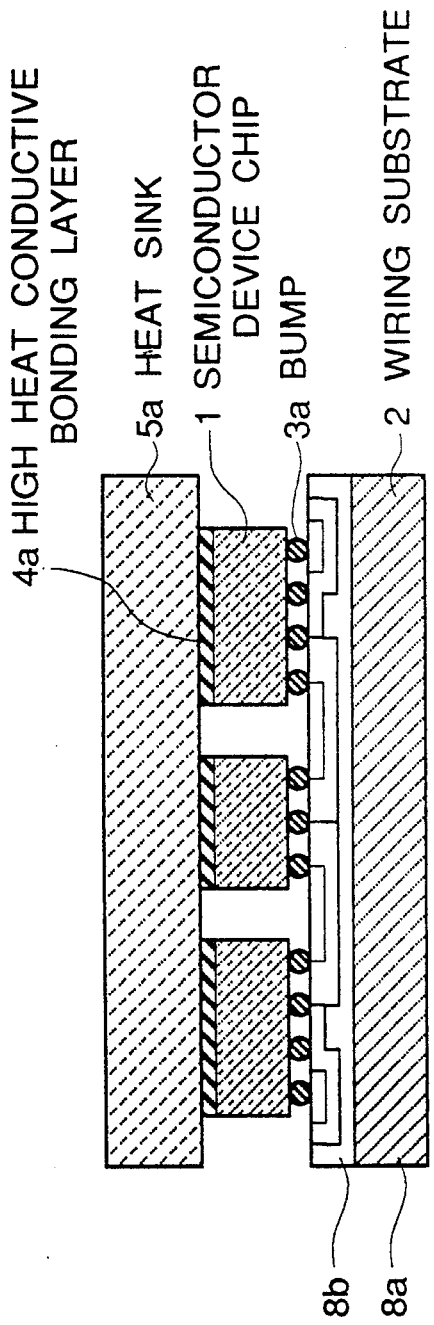
FIG. 1 is a diagrammatic sectional view of a first embodiment of the semiconductor device chip package structure in accordance with the present invention.

Referring to FIG. 1, there is shown a diagrammatic sectional view of a first embodiment of the semiconductor device chip package structure in accordance with the present invention. In the shown embodiment, a plurality of silicon semiconductor device chips 1 are electrically and mechanically connected to a silicon wiring substrate 2 by solder bumps 3a of $Pb_{95}Sn_5$. The silicon wiring substrate 2 is composed of a silicon substrate 8a and a multilayer wiring structure 8b formed on the silicon substrate 8a and formed of silicon oxide insulator layers and aluminum conductor layers. Thus, the silicon wiring substrate 2 supports the plurality of silicon semiconductor device chips 1.

In this embodiment, the bumps 3a have a diameter of 200 $\mu$m and a height of 200 $\mu$m, and therefore, very small. In addition, one hundred bumps 3a are provided for each of the silicon semiconductor device chips 1. Therefore, heat of the silicon semiconductor device chips 1 is hardly effectively transferred to the silicon wiring substrate 2.

A rear surface (namely, a top surface in FIG. 1) of the silicon semiconductor device chips 1 is bonded to a plate-like silicon heat sink 5a through a good heat conductive bonding layer 4a of $Pb_{60}In_{40}$. In this case, a CrCu thin film is formed on the bonding surface of each of the semiconductor device chips 1 and the heat sink 5a for metallization of these bonding surfaces.

With this arrangement, most of the heat generated in the semiconductor device chips 1 is effectively transferred to the silicon heat sink 5a of a high heat conductivity.

Figure 2:
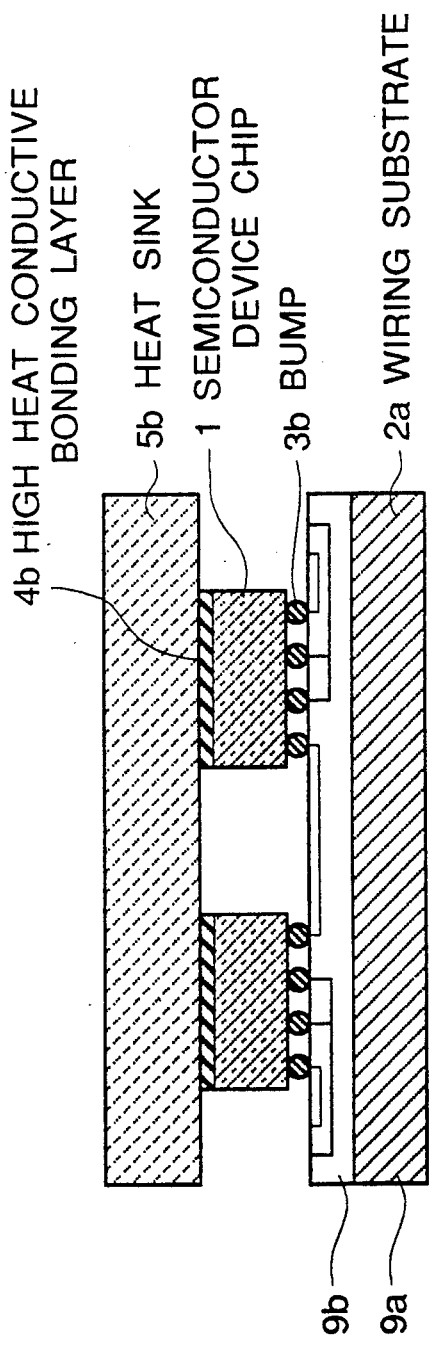
FIGS. 2 to 7 are diagrammatic sectional views of second to seven embodiments of the semiconductor device chip package structure in accordance with the present invention.

Referring to FIG. 2, the silicon semiconductor device chips 1 are electrically and mechanically connected to an aluminum nitride wiring substrate 2a by solder bumps 3b of $Pb_{90}Sn_{10}$. The aluminum nitride wiring substrate 2a composed of an aluminum nitride substrate 9a and a multilayer wiring structure 9b formed on the aluminum nitride substrate 9a and formed of polyimide insulator layers and copper conductor layers. A rear surface (namely, a top surface in FIG. 2) of the semiconductor device chips 1 is integrally bonded to a plate-like aluminum nitride heat sink 5b through a good heat conductive bonding layer 4b of $Pb_{80}In_{20}$.

Figure 3:
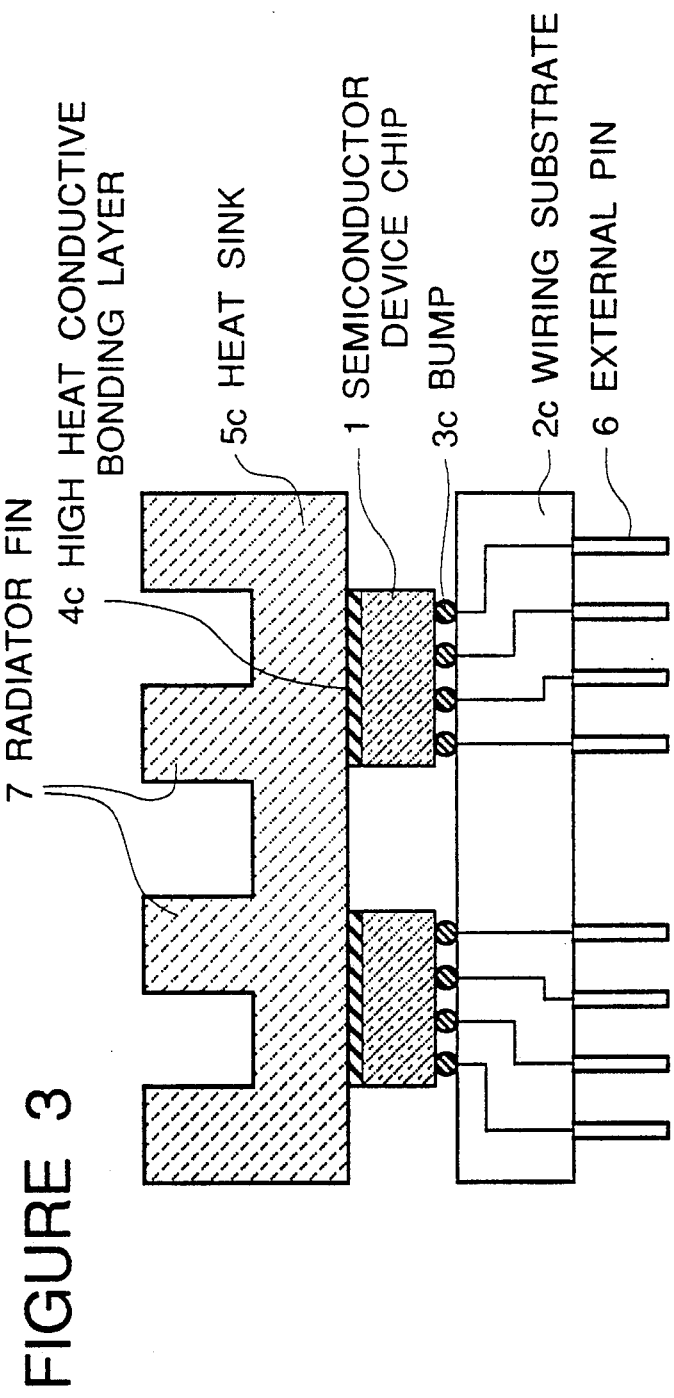

Referring to FIG. 3, the silicon semiconductor device chips 1 are electrically and mechanically connected by solder bumps 3c of $Pb_{95}In_5$ to a metallized surface of a wiring substrate 2c having a multilayer structure composed of aluminum nitride insulator layers and patterned tungsten conductor layers. The wiring substrate 2c has a plurality of external pins 6 which are internally connected to corresponding patterned tungsten conductor layers. A rear surface (namely, a top surface in FIG. 3) of the semiconductor device chips 1 is integrally bonded through a good heat conductive bonding layer 4c of an Ag epoxy type to an aluminum nitride heat sink 5c having radiator fins 7 so as to have an increased surface area. Thus, the heat generated in the semiconductor device chips 1 is effectively transferred to the aluminum nitride heat sink 5c.

In the above mentioned three embodiments, the rear surface of the semiconductor device chips directly connected to the wiring substrate by the bumps is integrally connected through the high heat conductive bonding layer to the heat sink formed of the same material as that of the wiring substrate. Thus, the heat generated in the semiconductor device chips is effectively dissipated to the head sink giving no stress fatigue to the bumps. Namely, since the wiring substrate and the heat sink are formed of the same material and since a plurality of semiconductor device chips are integrally connected to the wiring substrate and the heat sink, an excellent heat dissipatation property and a high connection reliability can be obtained. Accordingly, a semiconductor device having a high heat dissipatation property and a high connection reliability can be provided inexpensively.

Figure 4:
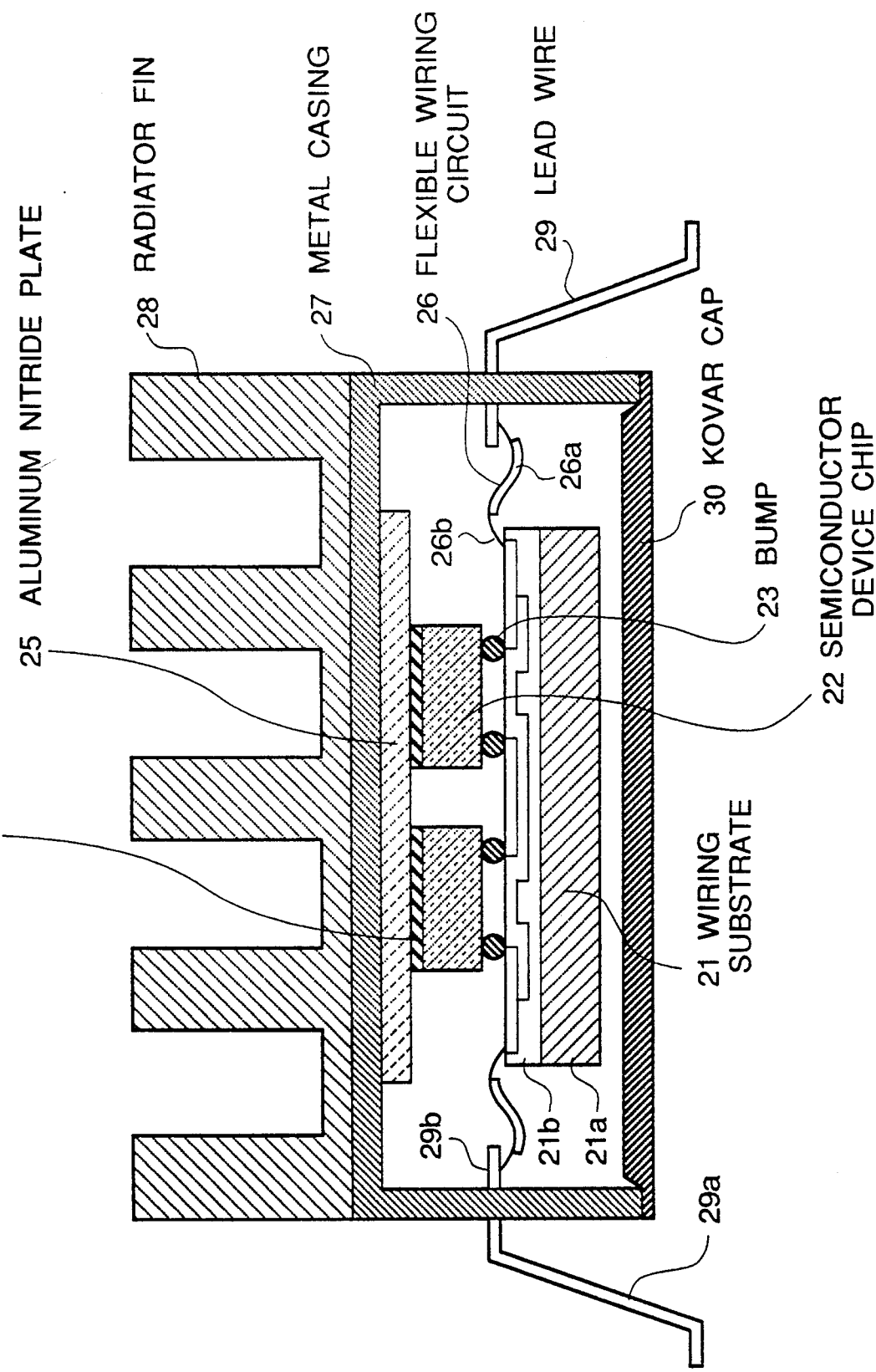

Referring to FIG. 4, there is shown a diagrammatic sectional view of a fourth embodiment of the semiconductor device chip package structure in accordance with the present invention.

In FIG. 4, a wiring substrate 21 is formed of a silicon substrate 21a and includes a multilayer wiring structure 21b formed on the silicon substrate 21a and composed of silicon oxide insulator layers and aluminum conductor patterned layers. Surface patterned conductors of the wiring substrate 21 are electrically and mechanically connected to a plurality of silicon semiconductor device chips 22 through bumps of $PB_{95}Sn_5$. A rear surface (namely, a top surface in FIG. 4) of the semiconductor device chips 22 is integrally bonded to a plate-like aluminum nitride heat sink 25 through a good heat conductive bonding layer 24 composed of a $Pb_{60}In_{40}$ solder.

The above mentioned assembly of the wiring substrate 21, the semiconductor device chips 22, and the heat sink 25 is accommodated in a metal casing 27 of KOVAR in such a manner that the heat sink 25 is bonded to an inner bottom surface of the metal casing 27. The metal casing 27 has a plurality of lead pins or wires 29 extending from the inside of the metal casing through a side wall of the metal casing to the outside of the metal casing so as to form external pins 29a. These lead wires 29 are supported by the side wall of the metal casing through an insulator material (not shown).

The surface patterned conductors of the wiring substrate 21 are electrically connected to corresponding inner conductor portions 29b of the lead wires 29 through a flexible wiring circuit member 26, which is formed of a polyimide insulator film 26a of 35 μm in thickness and patterned copper conductors 26b of 35 μm in thickness formed on the polyimide insulator film 26a.

The KOVER metal casing 27 is sealed with a KOVER cap 30, and a radiator fin block 28 for air cooling is bonded to an outer bottom surface of the metal casing 28 opposite to the heat sink 25.

In the above mentioned structure, a plurality of semiconductor device chips 21 are connected to the wiring substrate 21 by the bumps 23, and the wiring substrate 21 is connected to the inner conductors 29b of the package casing 27 through the flexible wiring circuit member 26. Accordingly, no compress stress acts on the bumps, and therefore, a high density package structure having a high reliability of connection and a high heat dissipation property can be realized.

Figure 5:
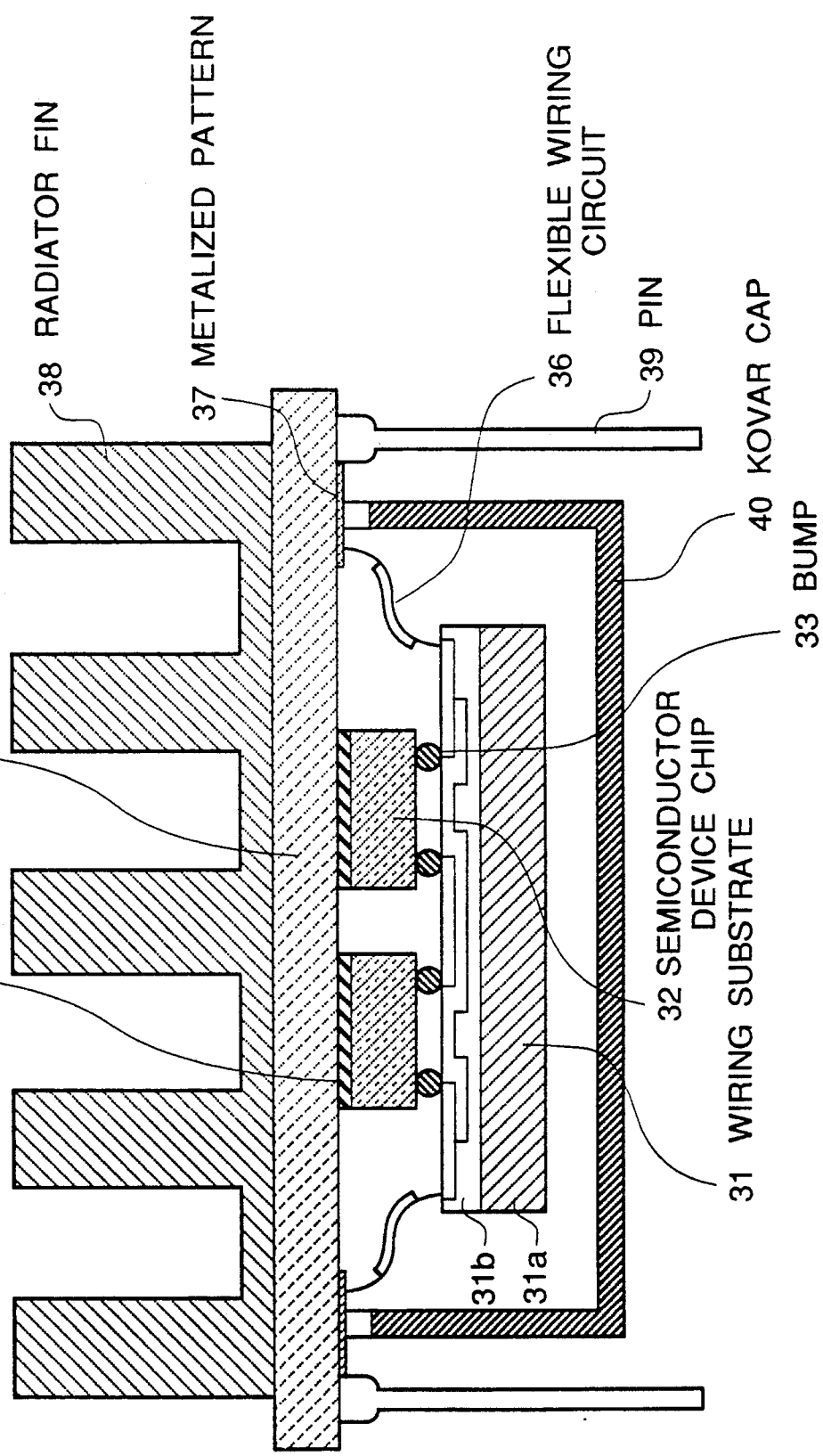

Referring to FIG. 5, semiconductor device chips 32 are electrically and mechanically connected through bumps of $PB_{95}In_5$ to a wiring substrate 31 which is formed of a silicon substrate 31a and which includes a multilayer wiring structure 31b formed on the silicon substrate 31a and composed of polyimide insulator layers and copper conductor patterned layers. A rear surface (namely, a top surface in FIG. 5) of the semiconductor device chips 32 is integrally bonded through an Ag-epoxy bonding layer 34 to an aluminum nitride substrate 35 which also functions as a heat sink.

Au-metallized patterns 37 are formed on the surface of the aluminum nitride substrate 35 on which the semiconductor device chips 32 are bonded, so that pads, wiring conductors and pin connection portions are formed. A plurality of Au-plated connection pins 39 of KOVAR are fixed to the aluminum nitride substrate 35 by an AuSn solder, so as to extend upright from the aluminum nitride substrate 35. The connection pins 39 are connected with corresponding pin connection portions of the metallized patterns 37.

The surface patterned conductors of the wiring substrate 31 are electrically connected to corresponding pads of the metallized patterns 37 through a flexible wiring circuit member 36, which is formed of a polyimide insulator film and patterned copper conductors, similarly to the flexible wiring circuit member 26 of the embodiment shown in FIG. 4.

The KOVER metal cap 40 is bonded on the aluminum nitride substrate 35 by a bonding agent (not shown), so that the assembly of the wiring substrate 31 and the semiconductor device chips 32 is accommodated in a sealed casing formed of the aluminum nitride substrate 35 and the metal can 40. In addition, a radiator fin block 38 for air cooling is bonded to an outer surface of the aluminum nitride substrate 35 opposite to the semiconductor device chips 32.

Thus, the heat generated in the semiconductor device chips 32 is transferred through the head conductive bonding layer 34 and the aluminum nitride substrate 35 to the radiator fin block 38, so that the semiconductor device chips 32 are cooled by the radiator fin block 38.

Figure 6:
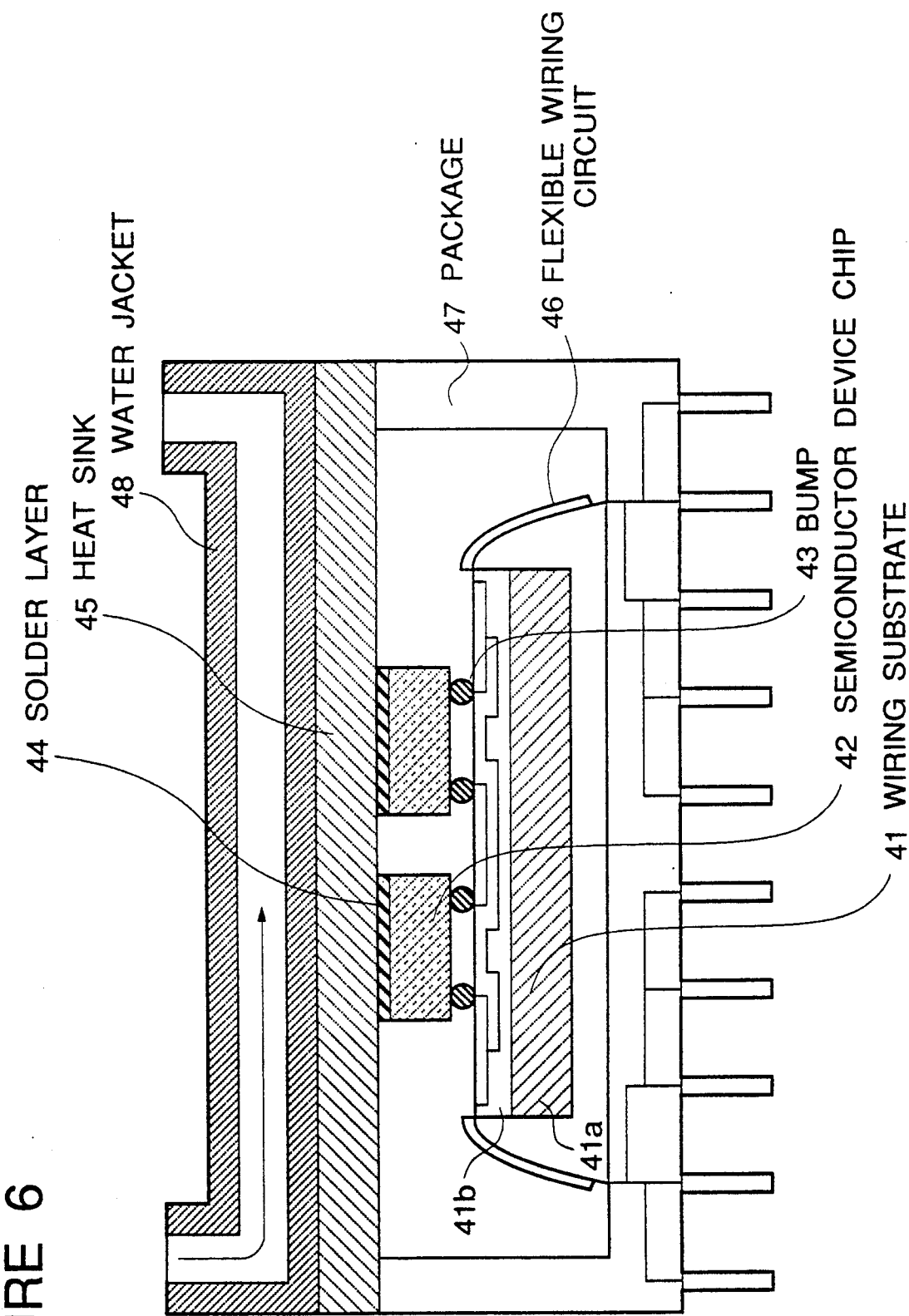

Referring to FIG. 6, semiconductor device chips 42 are electrically and mechanically connected through bumps 43 of $Pb_{90}In_{10}$ to a wiring substrate 41 which is formed of an alumina substrate 41a and which includes a multilayer wiring structure 41b formed on the alumina substrate 41a and composed of polyimide insulator layers and metal conductor patterned layers. A rear surface (namely, a top surface in FIG. 6) of the semiconductor device chips 42 is integrally bonded through a solder layer 44 of $Sn_{96.5}Ag_{3.5}$ to a copper-tungsten heat sink 45.

The copper-tungsten heat sink 45 is fixed with a water jacket 48, so that the copper-tungsten heat sink 45 is cooled by the water jacket 48. With this arrangement, the heat generated in the semiconductor device chips 42 is transferred through the head conductive bonding layer 44 and the heat sink 45 to the water jacket 48, so that the semiconductor device chips 42 are water-cooled by the water jacket 48.

The surface patterned conductors of the wiring substrate 41 are electrically connected to corresponding conductors of an alumina package 47 through a flexible wiring circuit member 46, which is formed of a polyimide insulator film and patterned copper conductors, similarly to the flexible wiring circuit member 26 of the embodiment shown in FIG. 4.

Figure 7:
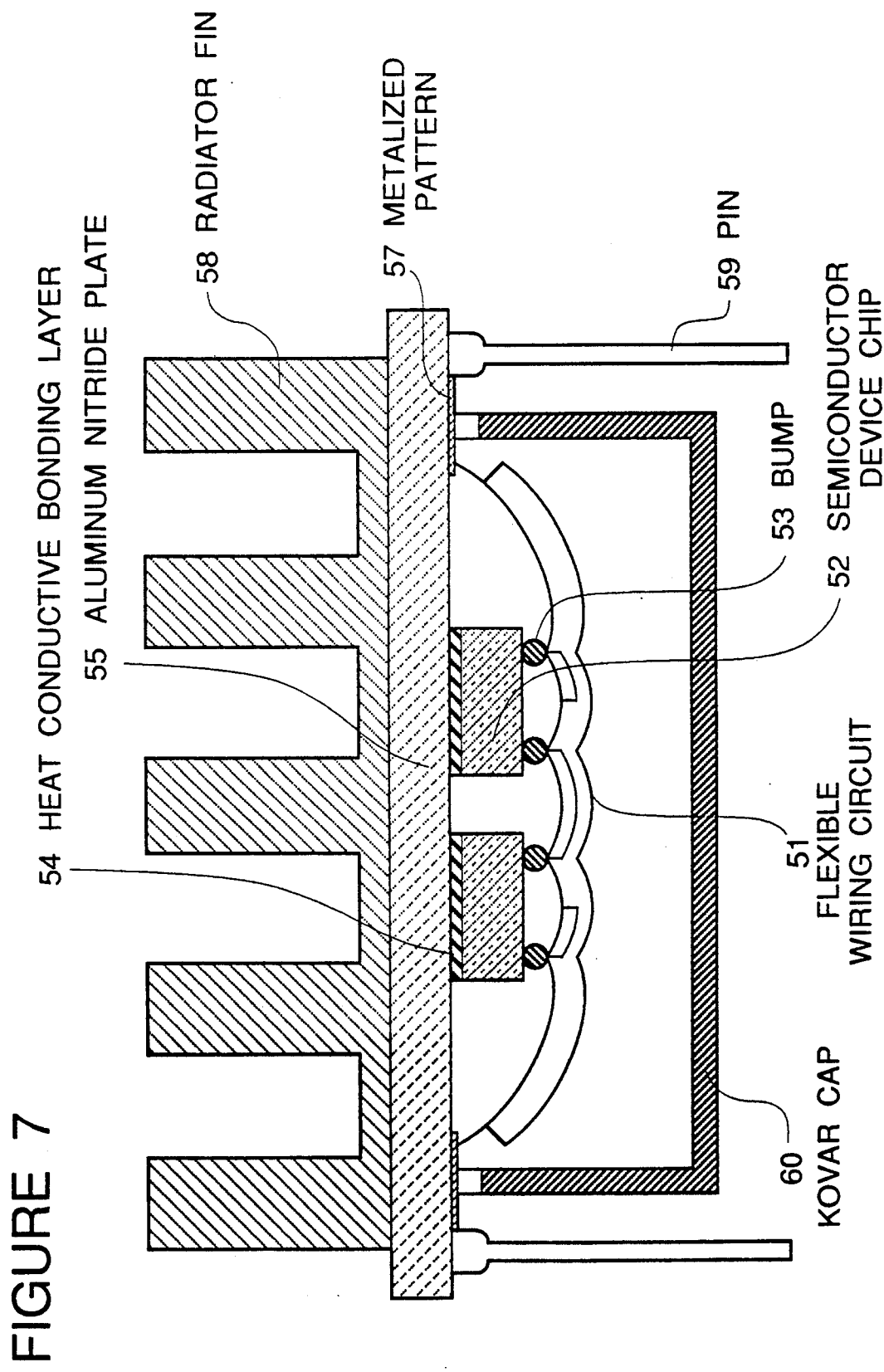

Referring to FIG. 7, there is shown a modification of the embodiment shown in FIG. 5. Namely, an aluminum nitride substrate 55 similar to the aluminum nitride substrate 35 of FIG. 5 is used. Semiconductor device chips 52, bumps 53, a heat conductive bonding layer 54, metallized patterns 57, a radiator fin block 58 and external connection pins 59 are the same as corresponding ones of the embodiment shown in FIG. 5. The modification shown in FIG. 7 is different from the embodiment shown in FIG. 5, in that a wiring substrate connected to the semiconductor device chips 52 is formed of a flexible wiring circuit member 51, which is formed of a polyimide insulator film and patterned conductors, similarly to the flexible wiring circuit member 26 of the embodiment shown in FIG. 4. In addition, the wiring substrate formed of the flexible wiring circuit member 51 is directly connected to pads of the metallized patterns 57 formed on the aluminum nitride substrate 55.

In the above mentioned embodiments shown in FIGS. 4 to 7 in which a plurality of semiconductor device chips are connected to the wiring substrate by the bumps and integrally bonded to the heat sink by the heat conductive bonding layer, the wiring substrate is connected to the conductors of the package casing through the flexible wiring circuit member. Accordingly, the heat generated in the semiconductor device chips can be effectively dissipated through the heat sink with giving no stress fatigue on the bumps, and therefore, a high density package structure having a high reliability of connection and a high heat dissipation property can be realized.

In addition, if signal line patterned conductors and ground pattern conductors are formed on the flexible wiring circuit member, it is possible to easily control the characteristic impedance. Furthermore, if the flexible wiring circuit member is connected to a circuit board, it is possible to test only a module in which a plurality of semiconductor device chips are assembled on the circuit board.

If only the pattern of the flexible wiring circuit member is modified, it is possible to use the same package.

The invention has thus been shown and described with reference to the specific embodiments. However, it should be noted that the present invention is in no way limited to the details of the illustrated structures but changes and modifications may be made within the scope of the appended claims.

I claim:

1. A packaged semiconductor device comprising:
   a wiring substrate;
   a plurality of semiconductor device chips each having a first surface electrically and mechanically connected to said wiring substrate by use of bumps;
   a package casing having internal conductor means positioned in the inside of said package casing, external connection conductor means extending outwardly from said package casing and being connected to corresponding internal conductor means, said semiconductor device chips and said wiring substrate being accommodated in said package casing and said wiring substrate being connected to said internal conductor means of said package casing through a flexible wiring circuit member so that said semiconductor device chips and said wiring substrate are located within said package casing with a space being left between said package casing and said semiconductor device chips and said wiring substrate; and
   a heat sink connected through a high heat conductive means to a second surface of each of said semiconductor devices, said second surface being opposite to said first surface thereof.

2. A packaged semiconductor device claimed in claim 1 wherein said second surface of each of said semiconductor devices is bonded through a high heat conductive bonding layer to an inner surface of one wall of said package casing, and wherein said heat sink includes a heat radiating fin block for air cooling, said heat sink being bonded to an outer surface of said one wall of said package casing.

3. A packaged semiconductor device claimed in claim 1 wherein said flexible wiring circuit member is formed of a flexible insulator film with patterned metal conductors formed on said flexible insulator film, and said internal conductor means and said external connection conductor means of said package casing are formed of a plurality of lead pins which extend from the inside of said package casing through a side wall of said package casing to the outside of said package casing so as to form external pins and which are supported by the side wall of said package casing, said wiring substrate being connected to an internal end of said lead pins via said patterned metal conductors formed on said flexible insulator film.

4. A packaged semiconductor device claimed in claim 1 wherein said package casing is formed of a heat conductive and electrically insulative plate and a metal cap mounted on said plate so as to form a chamber defined by cooperation of said plate and said cap, and wherein said second surface of each of said semiconductor devices is bonded through a high heat conductive bonding layer to an inner surface of said plate, and said heat sink includes a heat radiating fin block for air cooling, which is bonded to an outer surface of said plate.

5. A packaged semiconductor device claimed in claim 1 wherein said flexible wiring circuit member is formed of a flexible insulator film with patterned metal conductors formed on said flexible insulator film, and wherein said package casing is formed of a heat conductive and electrically insulative plate and a metal cap mounted on said plate so as to form a chamber defined by a cooperation between said plate and said cap, said internal conductor means is formed of metallized patterns formed on an inner surface of said plate so as to extend from the inside of said cap to the outside of said cap and connected to said wiring substrate through said patterned metal conductors formed on said flexible insulator film, and said external connection conductor means are formed of a plurality of connection pins fixed to said plate so as to extend upright from said plate and each connected to a corresponding one of said metallized patterns.

6. A packaged semiconductor device comprising:
   a wiring substrate;

a plurality of semiconductor device chips each having a first surface electrically and mechanically connected to said wiring substrate by use of bumps;

a package casing having internal conductor means formed in a wall of said package casing and external connection conductor means extending outwardly from said package casing and connected to corresponding internal conductor means, said semiconductor device chips and said wiring substrate being accommodated in said package casing and said wiring substrate being connected to said internal conductor means of said package casing through a flexible wiring circuit member so that said semiconductor device chips and said wiring substrate are located within said package casing with a space being left between said package casing and said semiconductor device chips and said wiring substrate; and a heat sink connected through a high heat conductive means to a second surface of each of said semiconductor devices, said opposite surface being opposite to said first surface thereof.

7. A packaged semiconductor device claimed in claim 6 wherein said second surface of each of said semiconductor devices is bonded through a high heat conductive bonding layer to an inner surface of a second wall of said package casing opposite to said one wall having internal conductor means formed therein, and wherein said heat sink includes a water jacket, which is bonded to an outer surface of said second wall of said package casing.

8. A packaged semiconductor device comprising:

a package casing formed of a heat conductive and electrically insulative plate and a metal cap mounted on said plate so as to form a chamber defined by a cooperation between said plate and said cap;

a plurality of semiconductor device chips each having a first surface electrically and mechanically connected to an inner surface of said plate through a high heat conductive bonding layer;

a heat radiating fin block for air cooling, bonded to an outer surface of said plate;

a plurality of metallized patterns formed on an inner surface of said plate so as to extend from the inside of said cap to the outside of said cap;

a plurality of connection pins fixed to said plate so as to extend upright from said plate, each of said pins being connected to a corresponding one of said metallized patterns; and a flexible wiring circuit member formed of a flexible insulator film and patterned metal conductors formed on said flexible insulator film, each of said patterned metal conductors being connected at one of its ends to a second surface of a selected one of said semiconductor device chips by use of a bump and at its other end to a corresponding one of said metallized patterns.

* * * * *